United States Patent
Presti et al.

(10) Patent No.: US 8,004,368 B2
(45) Date of Patent: Aug. 23, 2011

(54) RADIO FREQUENCY AMPLIFIER WITH DIGITAL AMPLITUDE MODULATION AND METHOD FOR CONTROLLING THE DELIVERING OF POWER

(75) Inventors: Calogero Davide Presti, Caltanissetta (IT); Francesco Carrara, Acireale (IT); Antonino Scuderi, Misterbianco (IT); Guiseppe Palmisano, San Giovanni La Punta (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 87 days.

(21) Appl. No.: 12/586,067

(22) Filed: Sep. 15, 2009

(65) Prior Publication Data

US 2010/0109789 A1 May 6, 2010

(30) Foreign Application Priority Data

Sep. 15, 2008 (IT) .............................. MI2008A1642

(51) Int. Cl.
*H03C 1/00* (2006.01)
*H03C 3/00* (2006.01)
(52) U.S. Cl. ........ 332/149; 332/145; 332/151; 332/152; 330/10
(58) Field of Classification Search .................. 332/144, 332/145, 149, 151–154; 330/10
See application file for complete search history.

(56) References Cited

U.S. PATENT DOCUMENTS

| 4,580,111 | A | 4/1986 | Swanson |
| 6,255,906 | B1 | 7/2001 | Edison et al. |
| 7,091,778 | B2 * | 8/2006 | Gan et al. ...................... 330/136 |
| 7,363,014 | B2 * | 4/2008 | Nakamura et al. ......... 455/127.3 |
| 2005/0062529 | A1 | 3/2005 | Gan et al. |

FOREIGN PATENT DOCUMENTS

| EP | 0083727 | 7/1983 |
| WO | 2000038388 | 6/2000 |

OTHER PUBLICATIONS

Search Report for Italian Patent Application No. MI2008A1642; Jun. 23, 2009.

* cited by examiner

*Primary Examiner* — David Mis
(74) *Attorney, Agent, or Firm* — Lisa K. Jorgenson; Kevin D. Jablonski; Graybeal Jackson LLP

(57) ABSTRACT

A digital amplitude modulator. The digital amplitude modulator is configured to modulate the amplitude of an input carrier signal based on input digital data and generate a corresponding output signal. The digital amplitude modulator includes a first variable gain amplifier for receiving the input carrier signal and generating a corresponding first amplified carrier signal, a second variable gain amplifier for receiving the input digital data and generating corresponding digital amplitude control data and a plurality of selectively activatable amplifier stages. Each amplifier stage receives a replica of the first amplified carrier signal and generates a corresponding second amplified carrier signal when activated. The output signal corresponds to a combination of the second amplified carrier signals generated by the activated amplifier stages.

25 Claims, 10 Drawing Sheets

RADIO FREQUENCY AMPLIFIER WITH DIGITAL AMPLITUDE MODULATION AND METHOD FOR CONTROLLING THE DELIVERING OF POWER

PRIORITY CLAIM

The instant application claims priority from Italian Patent Application No. MI2008A1642, entitled RADIO FREQUENCY AMPLIFIER WITH DIGITAL AMPLITUDE MODULATION AND METHOD FOR CONTROLLING THE POWER, filed Sep. 15, 2008, which application is incorporated herein by reference in its entirety.

TECHNICAL FIELD

Embodiments of the present invention relate to the field of the electronic telecommunications. Particularly, embodiments of the present invention relate to amplification and amplitude modulation techniques for Radio-Frequency (RF) signals.

BACKGROUND

Modern wireless communication techniques make use of RF signals which are modulated both in phase and in amplitude. This allows for a significant increase in the transmission speed, i.e., the amount of transferred information per unit of time, without having to increase the bandwidth occupation.

Generally, the power of a signal transmitted by a transmitting apparatus has to be regulated based on the distance the signal has to travel for reaching the receiving apparatus. Therefore, practically the totality of all the modern radio transmitting apparatuses are provided with at least one amplifier circuit, referred to as power amplifier.

As it is well known to those skilled in the art, employing proper power amplifier topologies, it is possible to easily amplify a signal that is modulated only in phase with a high efficiency, i.e., using a relatively low amount of power. However, the amplification of an amplitude modulated signal is more difficult. Indeed, in order to amplify an amplitude modulated signal, known solutions provide for employing power amplifiers of the linear type, which are characterized by very low efficiencies.

In order to increase the efficiency of the amplification of an amplitude modulated RF signal, one prior approach provides a power amplifier adapted to be employed in the broadcast transmitter apparatuses for the (now obsolete) AM radio stations. In more detail, such a power amplifier includes a plurality of small (identical) elementary amplifiers having the same gain. The elementary amplifiers have inputs connected to an RF source (the carrier) and outputs connected to the primary windings of a transformer. The load of the transmitter apparatus (typically, an antenna) is connected to the secondary winding of such transformer. The turning on and turning off of each single elementary amplifier is determined by a respective control signal. The control signals are generated through a digitalization process of a further input signal containing the information relating the desired amplitude modulation to be impressed on the carrier. As a consequence, the amplitude of the output carrier is essentially proportional to the number of elementary amplifiers which are turned on, and thus to the value of the input signal.

Since the elementary amplifiers which are off dissipate a very small amount of power, the efficiency of the power amplifier is increased with respect to the previous solutions. In order to increase the resolution of the amplitude modulation, i.e., in order to improve the granularity with which the carrier amplitude may be defined, the power amplifier may be further provided with additional elementary amplifiers, each one having a gain equal to a respective fraction (e.g., ½, ¼, ⅛ and so on) of the gain of the previously described identical elementary amplifiers. Each elementary amplifier can include a full-bridge transistor circuit and an input transformer. In order to eliminate such input transformers, proper driving circuits can be included between the source of the RF carrier and the elementary amplifiers. In this way, it is possible to eliminate the input transformers, reducing manufacturing costs and the volume of the whole device. Moreover, with this solution, the power consumption is strongly reduced since the power required for driving the full-bridge transistor circuits may be entirely provided by the driving circuits.

Unfortunately, the above-mentioned solutions do not lend themselves to implementation in integrated circuits. Moreover, these solutions are not adapted to correctly operate at the frequencies used in modern wireless networks (0.7-5.8 GHz) because of the presence of the output transformer which is provided with a high number of windings.

Digital amplitude modulators adapted to be implemented in an integrated circuit can include an array of MOS controlled switches. The controlled switches are connected to an oscillator, which represents the RF source. The controlled switches are driven through a respective group of control bits, representing the desired amplitude. Thus, the amplitude of the output carrier is directly controlled by the value assumed by the control bits.

Although the above-mentioned solution is adapted to be implemented in an integrated circuit in order to reach the requested level of power, a further output amplifier is required. Moreover, the signal provided by the oscillator has to be amplified by a buffer amplifier, too, in order to efficiently drive the switches. Increasing the size of the controlled switches for draining a higher amount of power would require a corresponding increasing in the size of such buffer amplifier, reducing the global efficiency of the modulator.

A further limit of known digital amplitude modulators regards the field of code-multiplexed transmissions (such as in the CDMA and WCDMA transmission standards). Indeed, in these cases it is required that the average power transmitted from the mobile terminal is controllable over a wide range of values. For example, in a transmission following the WCDMA standard, the average power of the modulated carrier has to be varied by a factor higher than 10000000, i.e., higher than 70 dB. Known digital amplitude modulators cannot generate a signal having such a high power range, since the power generated by the smallest elementary amplifier would be exceptionally lower than the total power that can be generated.

It is thus desirable to have a digital amplitude modulator which can control the average power, and which is able to deliver a sufficiently high level of power for exploitation in a wireless mobile terminal.

SUMMARY

An embodiment of the present invention relates to a digital amplitude modulator. The digital amplitude modulator is configured to modulate the amplitude of an input carrier signal based on input digital data and generate a corresponding output signal. The digital amplitude modulator includes a first variable gain amplifier for receiving the input carrier signal and generating a corresponding first amplified carrier signal, a second variable gain amplifier for receiving the input digital data and generating corresponding digital amplitude control data and a plurality of selectively activatable amplifier stages. Each amplifier stage receives a replica of the first amplified carrier signal and generates a corresponding second amplified carrier signal when activated. The output signal corresponds to a combination of the second amplified carrier signals generated by the activated amplifier stages. The digital amplitude modulator further includes a driving circuit configured to receive the digital amplitude control data and activate a corresponding set of selected amplifier stages based on the digital amplitude control data, and a power controller unit configured to adjust the power delivered by the digital amplitude modulator by setting a first amplifying gain of the first variable gain amplifier and a second amplifying gain of the second variable gain amplifier.

Further embodiments of the present invention relate to corresponding methods for operating a digital amplitude modulator.

BRIEF DESCRIPTION OF THE DRAWINGS

These and other features and advantages of embodiments of the present invention will be best understood by reading the following detailed description, given purely by way of non-limitative example, to be read in conjunction with the accompanying drawings, wherein.

DETAILED DESCRIPTION

Figure 1:
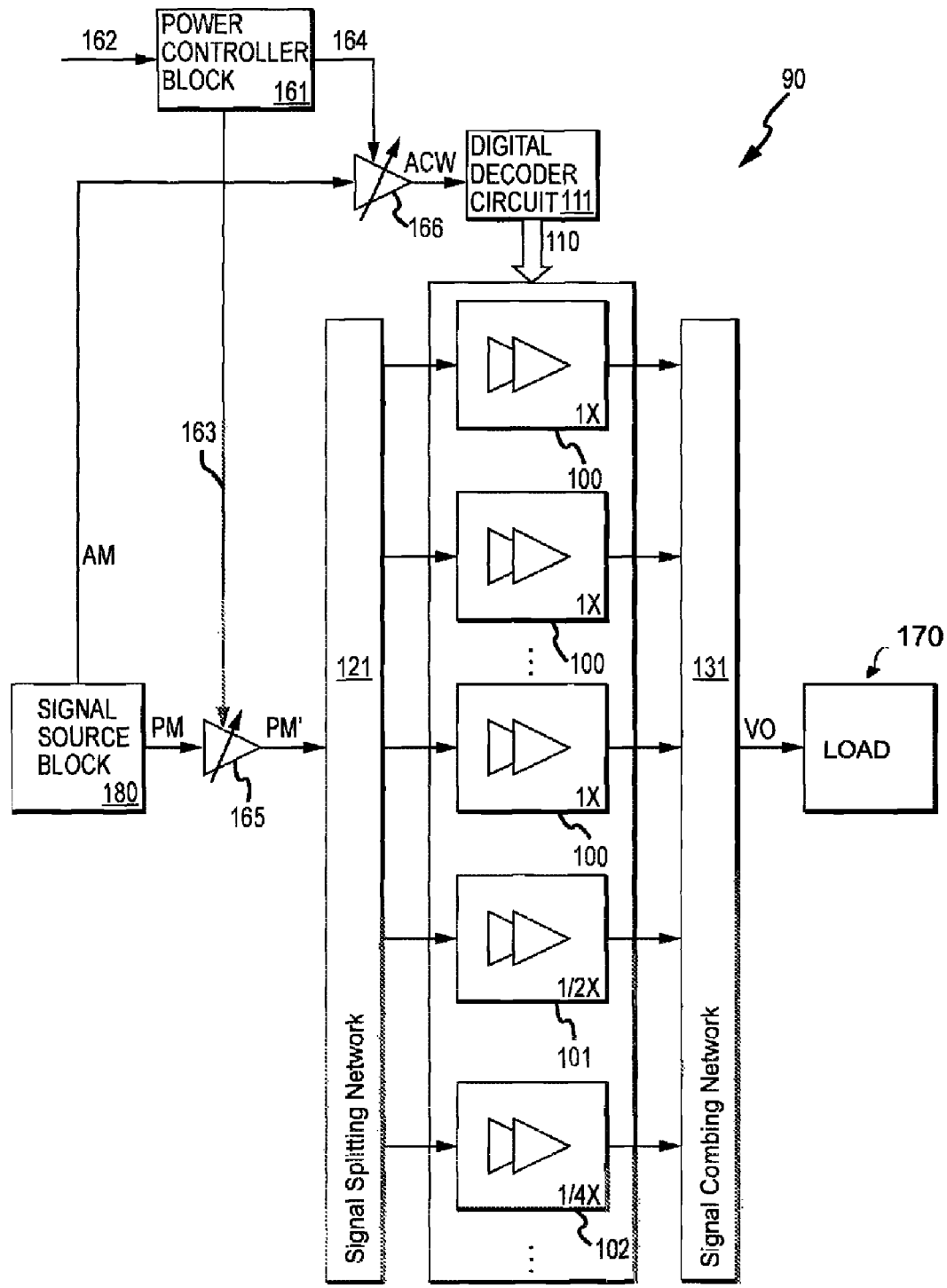
FIG. 1 illustrates a simplified block diagram of a digital amplitude modulator according to an embodiment of the present invention.

With reference to the drawings, FIG. 1 illustrates a simplified block diagram of a digital amplitude modulator 90 according to an embodiment of the present invention.

The digital amplitude modulator 90 includes a signal source block 180 adapted to generate an RF carrier signal PM—which may be modulated in phase—and a digital amplitude control signal AM. As will be described in greater detail in the following description, the digital amplitude control signal AM is a digital word whose value is exploited for accordingly modulating the amplitude of the carrier signal PM. The signal source block 180 may be implemented in several ways, using one of many suitable signal processing techniques known in the art. The signal source block 180 may also be provided with additional functions, such as temporal alignment and/or pre-distortion.

A power controller block 161 is responsible for regulating the average power delivered by the digital amplitude modulator 90. The power controller block 161 receives from the outside a power control command signal 162, e.g., a digital signal such as a digital word, whose value is indicative of a desired variation in the power to be delivered by the digital amplitude modulator 90. According to the power control command signal 162, the power controller block 161 generates a first gain control signal 163 and a second gain control signal 164.

The first gain control signal 163 is provided to a control terminal of a first variable gain amplifier 165; the first variable gain amplifier 165 has an input terminal coupled with the signal source block 180 for receiving the carrier signal PM and an output terminal for providing an amplified (or attenuated) version of the carrier signal PM, referred to as amplified carrier signal PM'. The gain of the first variable gain amplifier 165, referred to as KVGA, is determined by the value assumed by the first gain control signal 163.

The second gain control signal 164 is provided to a control terminal of a second variable gain amplifier 166; the second variable gain amplifier 166 has an input terminal coupled with the signal source block 180 for receiving the digital amplitude control signal AM and an output terminal for providing an amplified version of the digital amplitude control signal AM, referred to as amplitude control word ACW. The gain of the second variable gain amplifier 166, referred to as KDIG, is determined by the value assumed by the second gain control signal 164. According to an embodiment of the present invention, the resolution of the second variable gain amplifier 166 is such that the amplitude control word ACW is a digital word formed by a number N+M of bits.

The digital amplitude modulator 90 includes an array of $2^N$ amplifiers 100, referred to as unitary-weight cells; all the unitary weight cells 100 have the same gain.

The digital amplitude modulator 90 also includes a further array of M amplifiers 101, 102, referred to as fractional-weight cells; the gain of each fractional-weight cell is a respective fraction ½, ¼, ⅛ ... of the gain of the unitary weight cells 100. In the example illustrated in FIG. 1, wherein the fractional-weight cells are only two, the fractional-weight cell identified with the reference 101 has a gain equal to ½ of the gain of the unitary weight cells 100, while the fractional-weight cell identified with the reference 102 has a gain equal to ¼ of the gain of the unitary weight cells 100.

The output terminal of the first variable gain amplifier 165 is coupled with a signal splitting network 121; the signal splitting network 121 is coupled with input terminals of all the $2^N$ unitary-weight cells 100 and with input terminals of all the M fractional-weight cells 101, 102 for providing a replica of the amplified carrier signal PM' received from the first variable gain amplifier 165 thereto.

The output terminal of the second variable gain amplifier 166 is coupled with a digital decoder circuit 111 for providing the amplitude control word ACW thereto. As will be described in greater detail, the N+M bits of the amplitude control word ACW are used by the digital decoder circuit 111 for generating $2^N$+M digital control signals 110. Each digital control signal 110 is provided to a respective one among the $2^N$ unitary-weight cells 100 and the M fractional-weight cells 101, 102, and its value determines if such cell is turned on or turned off.

The digital amplitude modulator 90 further includes a signal combining network 131 for receiving the signals generated by the $2^N$ unitary-weight cells 100 and by the M fractional-weight cells 101, 102, and providing a corresponding output signal VO to a load 170. The output signal VO is substantially proportional to the sum of the signals outputted by the $2^N$ unitary-weight cells 100 and by the M fractional-weight cells 101, 102 which are turned on.

In order to illustrate how the digital amplitude modulator 90 operates according to an embodiment of the present invention, it is supposed that it is desired to generate an output signal VO which is modulated both in phase and in amplitude, i.e.

$$VO(t)=A(t)\cos((wc)t+f(t)),$$

wherein t represents the time, (wc) is the angular frequency of the non-modulated carrier, f(t) is the phase-modulation of the carrier, and A(t) is the amplitude modulation of the carrier.

For this purpose, the signal source block 180 generates a phase modulated carrier signal PM equal to:

$$PM(t)=APM\cos((wc)t+f(t)),$$

wherein APM is a constant factor, and a digital word AM(t)—whose bits vary in time—represents the digital amplitude control signal AM.

The phase modulated carrier signal PM is amplified by the first variable gain amplifier 165 so as to generate the amplified carrier signal PM':

$$PM'(t)=APM\,KVGA\cos((wc)t+f(t)),$$

wherein the value of the gain KVGA of the first variable gain amplifier 165 is based on the first gain control signal 163. When the gain KVGA is set to a value lower than one, the amplified carrier signal PM' is lower than the modulated carrier signal PM.

According to an embodiment of the present invention, the digital amplitude control signal AM is amplified (or attenuated) by the second variable gain amplifier 166 so as to obtain the N+M bits of the amplitude control word ACW according to the following equation:

$$ACW(t)=KDIG\,AM(t),$$

wherein the value of the multiplication factor corresponding to the gain KDIG of the second variable gain amplifier 166 is based on the second gain control signal 164.

The digital decoder circuit 111 converts the N+M bits of the amplitude control word ACW so as to generate the $2^N$+M digital control signals 110. Particularly, the M least significant bits of the amplitude control word ACW are reproduced without any modification and used for the selective activation/deactivation of the M fractional-weight cells 101, 102. The N most significant bits of the amplitude control word ACW are instead decoded from the binary representation to a $2^N$ representation, and used for the selective activation/deactivation of the $2^N$ unitary-weight cells 100.

For example, if N=7, M=2, meaning that the digital control signals 110 are 127+2, and particularly 127 corresponding to the N most significant bits of the amplitude control word ACW and 2 corresponding to the M least significant bits of the amplitude control word ACW, and if at the time t the amplitude control word ACW is equal to 101011001, the N most significant bits represent the number 86, while the M least significant bits represent the number 1. According to this example, among the 127 digital control signals 110 corresponding to the N most significant bits of the amplitude control word ACW, 86 digital control signals 110 are asserted (for example, to the high logic value "1"), while the remaining 127−86=41 are deasserted (for example, to the low logic value "0"); moreover, a first digital control signal 110 corresponding to the M least significant bits is asserted, while the remaining one is deasserted.

According to an embodiment of the present invention, the unitary-weight cells 100 whose corresponding digital control signal 110 is asserted are turned on, while the ones whose corresponding digital control signal 110 is deasserted are turned off. Similarly, the fractional-weight cells 101, 102 whose corresponding digital control signal 110 is asserted are turned on, while the ones whose corresponding digital control signal 110 is deasserted are turned off. Therefore, a number of unitary-weight cells 100 corresponding to the value assumed by the N most significant bits of the amplitude control word ACW are turned on. Considering also the contribution of the fractional-weight cells 101, 102, it can be appreciated that the amplitude of the output signal VO is proportional to the amplitude control word ACW.

More particularly, indicating with A0 the gain of the generic unitary-weight cell 100, i.e., the gain of the "smallest" fractional-weight cell 101 is equal to $A0/2^M$, the resulting output signal VO provided to load 170 is equal to $A0/2^M$ ACW(t) times the amplified carrier signal PM' outputted by the first variable gain amplifier 165, i.e.:

$$VO(t)=A0/2^M\,APM\,KVGA\,ACW(t)\cos((wc)t+f(t))=\\A0/2^M\,APM\,KVGA\,KDIG\,AM(t)\cos((wc)t+f(t)).$$

Therefore, the amplitude A(t) of the output signal VO is equal to:

$$A(t)=A0/2^M\,APM\,KVGA\,KDIG\,AM(t).$$

The proposed solution allows modulation of the amplitude of the carrier through the factor AM(t), and, more importantly, controlling the average power delivered by the digital amplitude modulator through the factors KVGA and KDIG (i.e., through the gains of the variable gain amplifiers 165, 166). Thus, according to the proposed solution, the amplitude modulation and the control of the power are performed by different portions of the system. Unlike the known solutions wherein the control of the power and the amplitude modulation are performed jointly, for example, through a same digital word, the proposed solution allows the digital amplitude modulator 90 to correctly operate delivering an average power that may vary within a high range of values.

Figure 2:
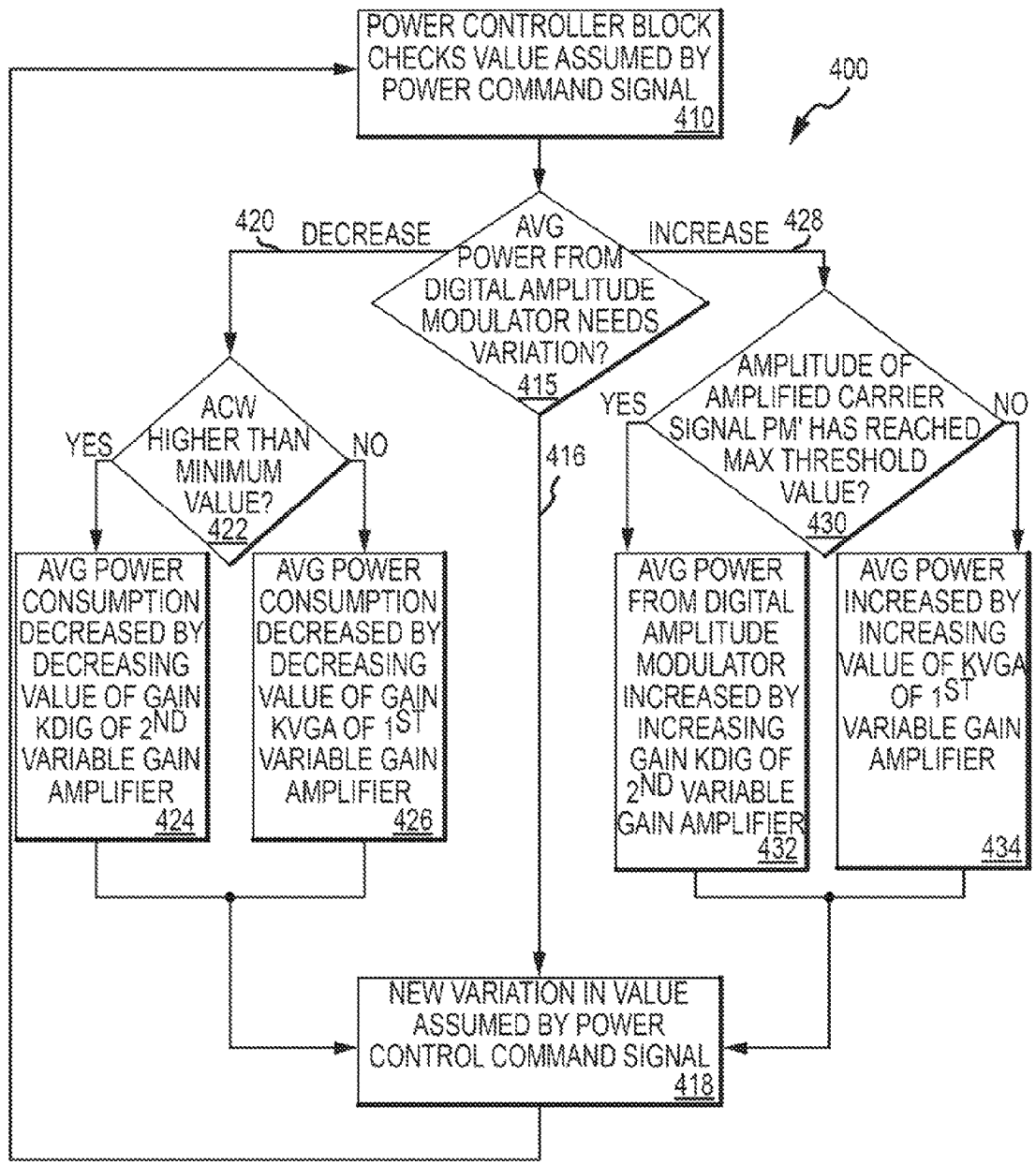
FIG. 2 illustrates a flow diagram depicting a method for controlling the average power delivered by the digital amplitude modulator of FIG. 1 according to an embodiment of the present invention.

Particularly, the way the average power delivered by the digital amplitude modulator 90 is controlled and regulated according to an embodiment of the present invention is now described making reference to the flow chart 400 illustrated in FIG. 2.

Firstly, the power controller block 161 checks the value assumed by the power control command signal 162 (block 410). Based on such value, the power controller block 161 may drive the first variable gain amplifier 165 or the second gain amplifier 166 so as to vary the gains KVGA or KDIG.

If the power control command signal 162 indicates that the average power delivered by the digital amplitude modulator 90 does not need any variation (exit branch 416 of block 415), the actual values assumed by the gains KVGA or KDIG are maintained until a variation in the value assumed by the power control command signal 162 occurs (block 418, then return to block 410 when the value of the control command signal 162 changes).

If the power control command signal 162 indicates that the average power consumed by the digital amplitude modulator 90 should be decreased (exit branch 420 of block 415), a check is made on the actual value assumed by the amplitude control word ACW outputted by the second variable gain amplifier 166 (block 422). Particularly, if the length (resolution) of the amplitude control word ACW, given by the position of the most significant bit of the word which is equal to "1", is higher than a minimum threshold value, the average power consumption is decreased by decreasing the value of the gain KDIG of the second variable gain amplifier 166 (block 424). By reducing the value of KDIG, the value (and thus, the length) of the amplitude control word ACW is reduced, and a corresponding number of unitary-weight cells 100 and/or fractional-weight cells 101, 102 which before were turned on are now turned off, reducing the amplitude of the output signal VO without modifying the amplitude modulation given by the factor AM(t).

If instead the length of the amplitude control word ACW is lower than or equal to the minimum threshold value, it means that the actual resolution of the amplitude control word ACW is such that a further reduction of KDIG would negatively affect the accuracy of the amplitude modulation, since the factor AM(t) would not be represented with a sufficiently precise word. For this purpose, in this case the actual value of KDIG is maintained, and the average power consumption is instead decreased by decreasing the value of the gain KVGA of the first variable gain amplifier 165 (block 426). In this way, instead of reducing the number of unitary-weight cells 100 and/or fractional-weight cells 101, 102 which are turned on, the power is reduced by reducing the amplitude of the amplified carrier signal PM' outputted by the first variable gain amplifier 165.

In both the two abovementioned cases, the new values assumed by the gains KVGA or KDIG are maintained until a new variation in the value assumed by the power control command signal 162 occurs (block 418, then return to block 410 when the value of the control command signal 162 changes).

If instead the power control command signal 162 indicates that the average power consumed by the digital amplitude modulator 90 should be increased (exit branch 428 of block 415), a check is made on the actual amplitude assumed by the amplified carrier signal PM' outputted by the first variable gain amplifier 165 (block 430). Particularly, if the amplitude of the amplified carrier signal PM' has reached a maximum threshold value, the average power delivered by the digital amplitude modulator 90 is increased by increasing the value of the gain KDIG of the second variable gain amplifier 166 (block 432). By increasing the value of KDIG, the value (and thus, the length) of the amplitude control word ACW is increased, and a corresponding number of unitary-weight cells 100 and/or fractional-weight cells 101, 102 which before were turned off are now turned on, increasing the amplitude of the output signal VO without modifying the amplitude modulation given by the factor AM(t). If instead the amplitude of the amplified carrier signal PM' is lower than the higher threshold value, the average power is increased by increasing the value of the gain KVGA of the first variable gain amplifier 165 (block 434), i.e., by increasing the amplitude of the amplified carrier signal PM' and maintaining the actual number of unitary-weight cells 100 and/or fractional-weight cells 101, 102 turned on.

Again, in both the two abovementioned cases, the new values assumed by the gains KVGA or KDIG are maintained until a new variation in the value assumed by the power control command signal 162 occurs (block 418, then return to block 410 when the value of the control command signal 162 changes).

With the proposed solution, the average power consumption is controlled efficiently, using the minimum number of unitary-weight cells 100 and fractional-weight cells 101, 102 required for a predetermined amplitude modulation resolution.

For example, in case it is desired to reduce the delivering of average power, the amplitude of the output signal VO is reduced by reducing the gain KDIG, and thus by reducing the number of unitary-weight cells 100 and/or fractional-weight cells 101, 102 which are turned on. In this way, power consumption can be strongly reduced over a wide range of values, since a turned off cell practically does not consume power. The limit of such power reduction is given by the desired resolution with which the amplitude modulation has to be represented. In case said limit is reached, the power reduction is performed by reducing the amplitude of the amplified carrier signal PM' through the reduction of the gain KVGA.

Figure 3:
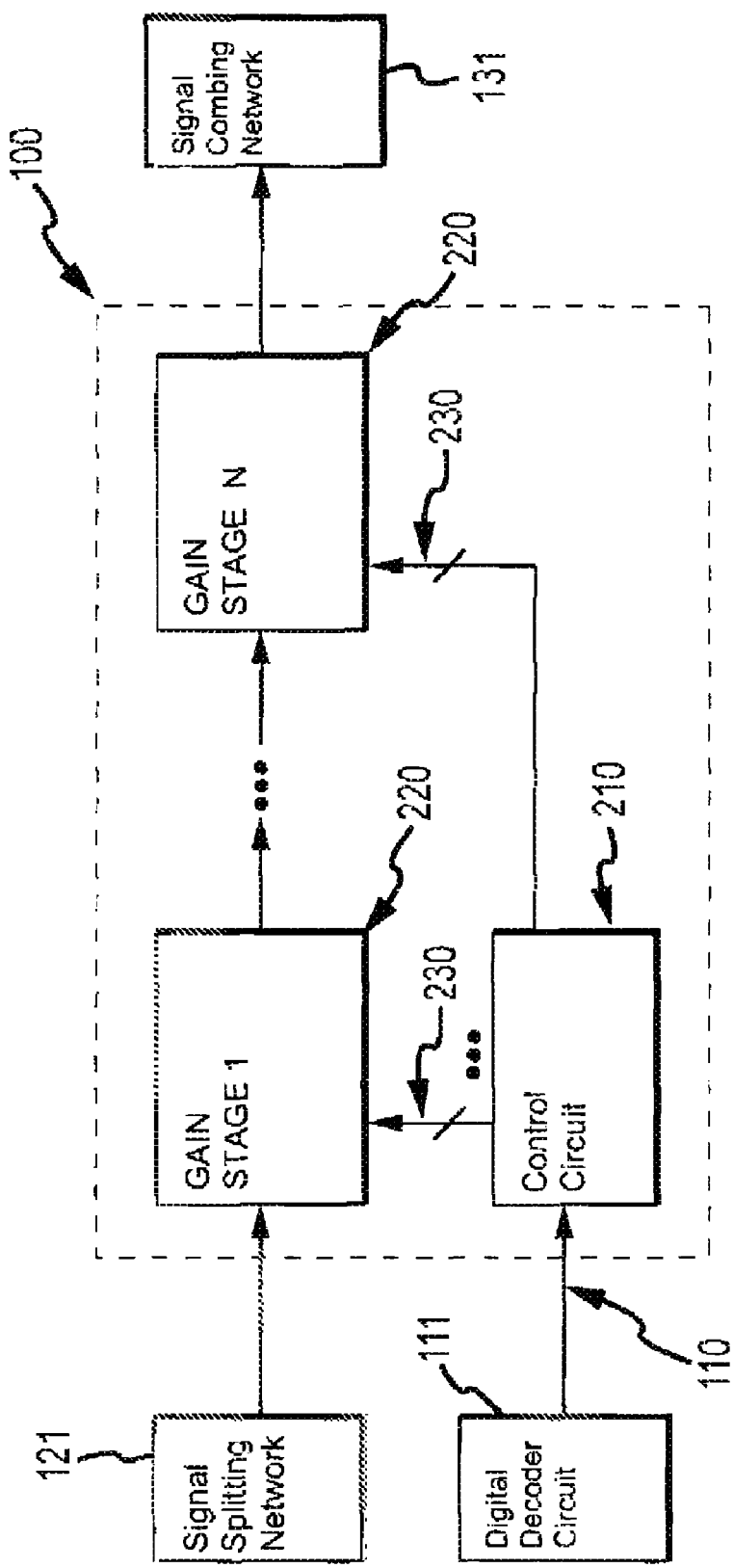
FIG. 3 illustrates the main topology of a generic unitary-weight cell included in the digital amplitude modulator of FIG. 1 according to an embodiment of the present invention.

The main topology of a generic unitary-weight cell 100 according to an embodiment of the present invention is illustrated in FIG. 3. The unitary-weight cell 100 includes at least one gain stage 220. In case the unitary-weight cell 100 includes more than one gain stage 220, the gain stages are cascade connected, with a first one having an input coupled with the signal splitting network 121 for receiving a replica of the amplified carrier signal PM' and a last one having an output terminal coupled with the signal combining network 131 for providing an amplified version of such signal (particularly, corresponding to A0 times the amplified carrier signal PM'). The turning on and off of each gain stage 220 included in the unitary-weight cell 100 is carried out by means of proper control signals 230 generated by a control circuit 210 based on the value assumed by the digital control signal 110 associated to such unitary-weight cell 100 among the $2^N+M$ digital control signals 110 generated by the digital decoder circuit 111. The main topology of the fractional-weight cells 101, 102 is equal to the topology illustrated in FIG. 3, with the difference that the area of the active elements forming the gain stages 220 is scaled down by a proper factor, equal to 2, 4, 8 . . . for obtaining cells having a weight equal to ½, ¼, ⅛ . . . , respectively.

As will be described in greater detail in the following description, the correct operation of the proposed digital amplitude modulator 90 is based on the assumption that the unitary-weight cells 100 and the fractional-weight cells 101, 102 are capable of efficiently operating even when the amplified carrier signal PM' is very small. Known solutions cannot operate in these conditions, since they require the elementary amplifiers include transistors used as switches to be controlled by large signals only.

For this purpose, in the following description there will be disclosed possible implementations of gain stages 220 that may be included in the unitary-weight cells 100 according to various embodiments of the present invention.

Figure 4:
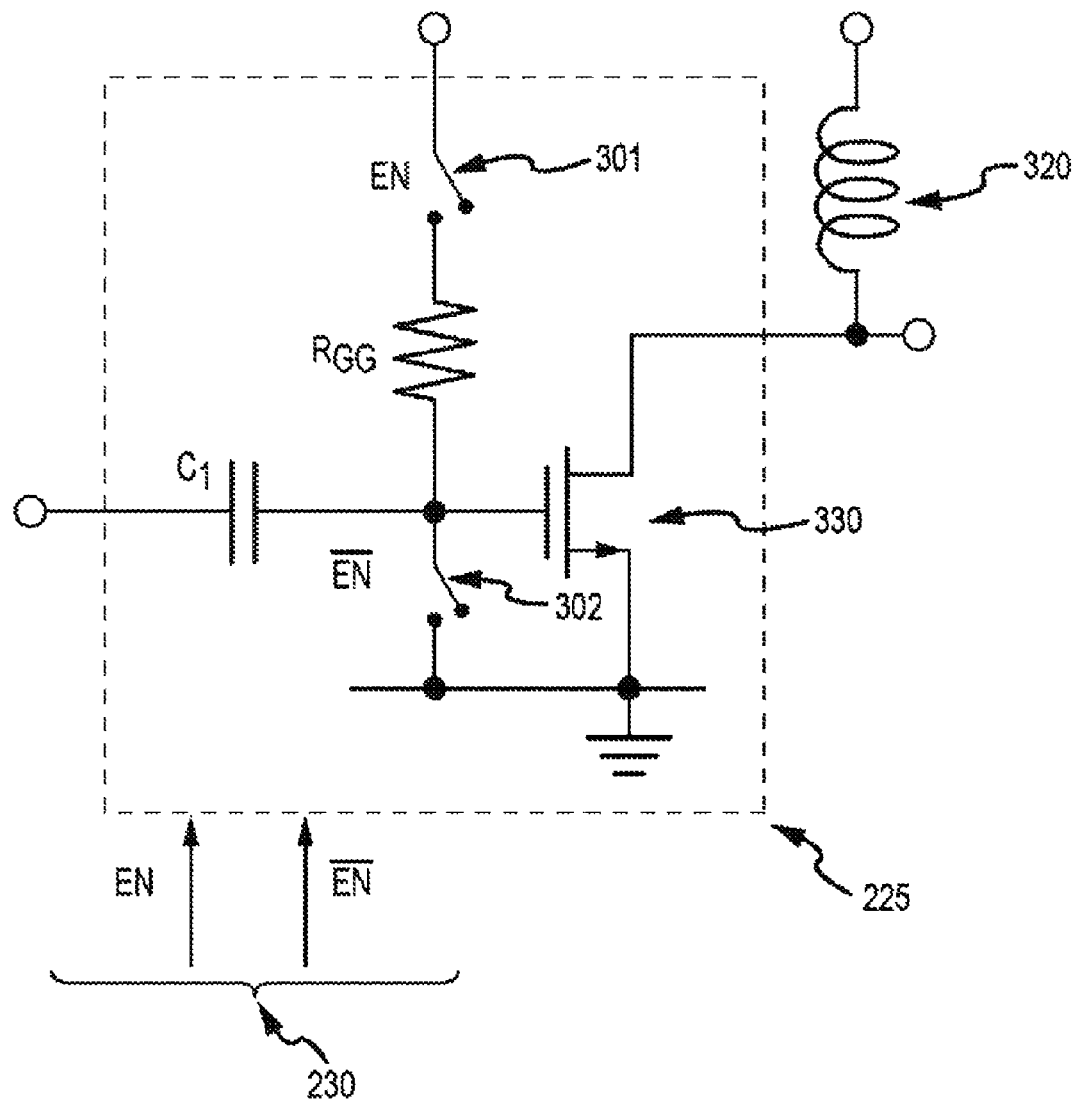
FIG. 4 illustrates a circuit implementation of a gain stage of the unitary-weight cell according to a first embodiment of the present invention.

A first implementation of the gain stage 220 according to an embodiment of the present invention is disclosed in FIG. 4 with the reference 225. This implementation is adapted to be exploited for the last gain stage 220 of the unitary-weight cells 100, i.e., the one whose output terminal is coupled with the signal combining network 131.

The gain stage 225 has an input terminal connected with a first terminal of a capacitor C1. The capacitor C1 has a second terminal connected to a gate terminal of a NMOS transistor 330; the NMOS transistor 330 has a source terminal connected to a terminal providing a reference voltage, such as the ground voltage, and a drain terminal connected to the output terminal of the gain stage 225. The gate terminal of the NMOS transistor 330 is further coupled to the terminal providing the ground voltage through a controlled switch 302. Moreover, the gate terminal of the NMOS transistor 330 is connected to a first terminal of a resistor RGG, a second terminal thereof being coupled with a terminal providing a bias voltage through a further controlled switch 301. The drain terminal of the NMOS transistor 330 is further coupled with a terminal providing a power supply voltage through an inductor 320. The controlled switches 301 and 302 are driven by two among the control signals 230 generated by the control circuit 210 included in the unitary-weight cell 100. Particularly, such two control signals 230 include a first digital control signal EN for driving the controlled switch 301 and a second digital control signal $\overline{EN}$, which is a complementary version of the first digital control signal EN, for driving the controlled switch 302.

When the gain stage 225 is on, the controlled switch 301 is closed and the controlled switch 302 is open. In this way the transistor 330 is biased by the resistor RGG. The signal provided to the input terminal is coupled to the gate of the NMOS transistor 330 through the capacitor C1. When the gain stage 225 is turned off, the controlled switch 301 is open and the controlled switch 302 is closed. The NMOS transistor 330 is thus turned off.

Figure 5:
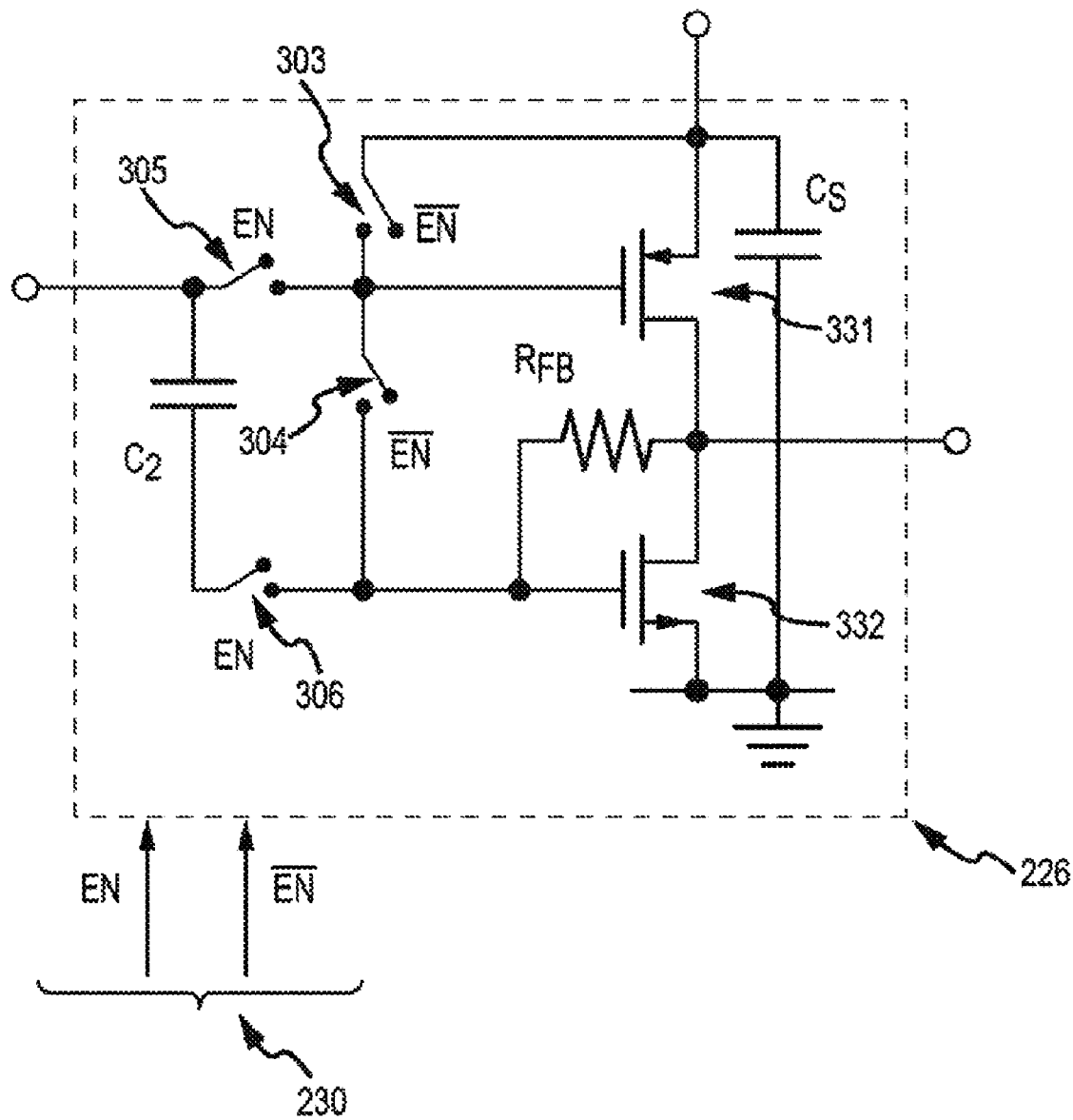
FIG. 5 illustrates a circuit implementation of a gain stage of the unitary-weight cell according to a second embodiment of the present invention.

A second implementation of the gain stage 220 according to an embodiment of the present invention is disclosed in FIG. 5 with the reference 226. The gain stage 226 has an input terminal coupled with a gate terminal of a PMOS transistor 331 through a controlled switch 305; the PMOS transistor 331 has a source terminal connected to a terminal providing the power supply voltage and a drain terminal connected to a drain terminal of an NMOS transistor 332. The input terminal of the gain stage 226 is connected to a first terminal of a capacitor C2; the capacitor C2 has a second terminal coupled with a gate terminal of the NMOS transistor 332 through a controlled switch 306. The NMOS transistor 332 further includes a source terminal connected to a terminal providing the ground voltage. The gate terminal of the NMOS transistor 332 is coupled with the drain terminal thereof through a resistor RFB. Moreover, the gate terminal of the PMOS transistor 331 is coupled with the gate terminal of the NMOS transistor 332 through a further controlled switch 304 and connected to a first terminal of a capacitor CS through a still further controlled switch 303. The capacitor CS has a second terminal that is connected to a terminal providing the ground voltage. The gain stage 226 includes an output terminal connected to the drain terminals of the transistors 331 and 332. As in the gain stage 225, the controlled switches 303, 304, 305 and 306 are driven by the digital control signals EN and $\overline{EN}$. Particularly, the digital control signal EN drives the controlled switches 305 and 306 and the second digital control signal $\overline{EN}$ drives the controlled switches 303 and 304.

When the gain stage 226 is turned on, the controlled switches 305 and 306 are closed, while the controlled switches 303 and 304 are open. In this way the transistor 331 is directly biased by the input signal itself, while the transistor 332 is self-biased thanks to the resistor RFB. The input signal is directly coupled with the transistor 331, and coupled with the transistor 332 through the capacitor C2. When the gain stage 226 is turned off, the controlled switches 303 and 304 are closed, while the controlled switches 305 and 306 are open. In this condition, the transistor 331 is turned off and no current flows. The capacitor CS is used for filtering the high frequency signals that may be superimposed on the power supply voltage.

Figure 6:
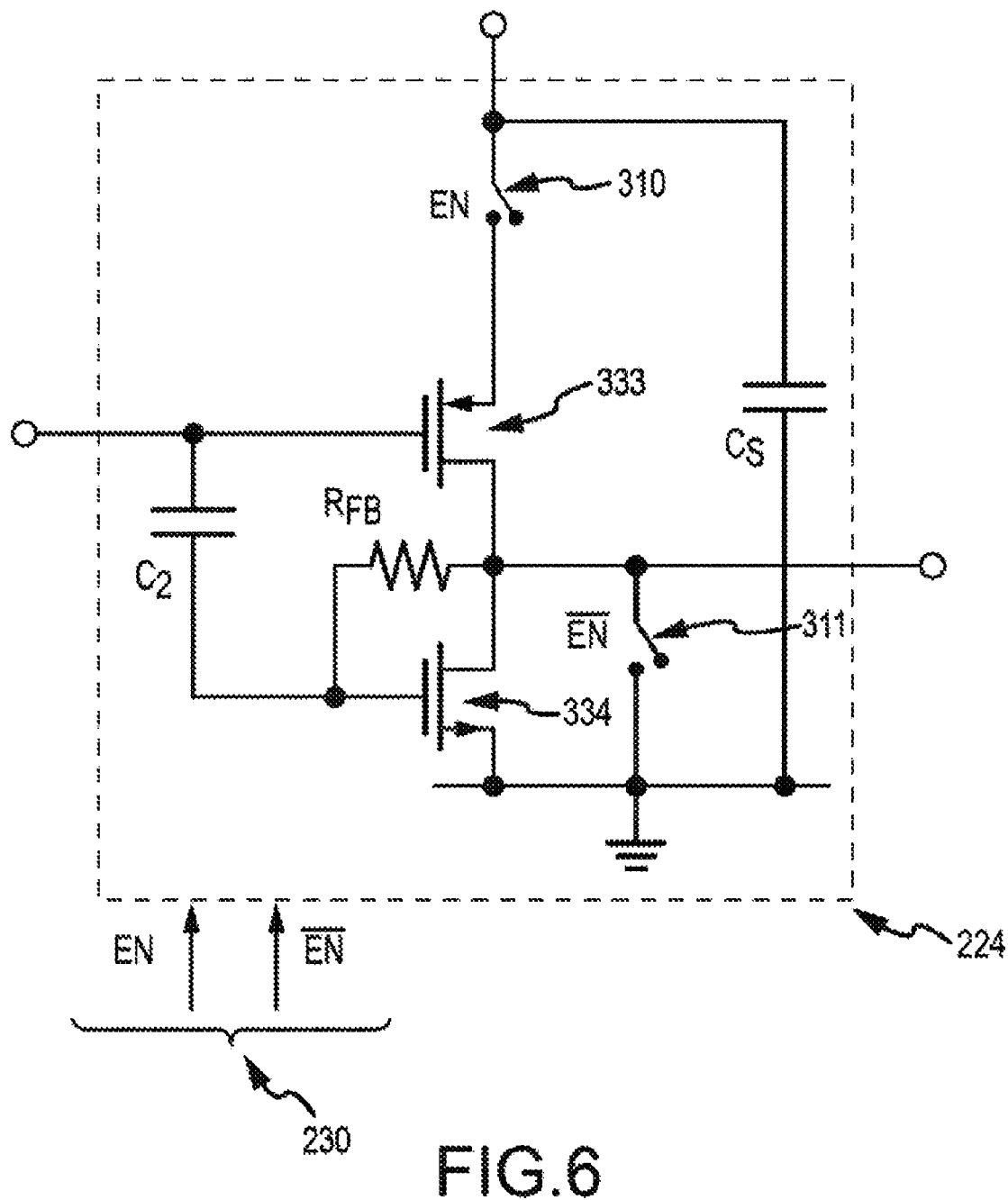
FIG. 6 illustrates a circuit implementation of a gain stage of the unitary-weight cell according to a third embodiment of the present invention.

A third implementation of the gain stage 220 according to an embodiment of the present invention is disclosed in FIG. 6 with the reference 224. The gain stage 224 has an input terminal coupled with a gate terminal of a PMOS transistor 333; the PMOS transistor 333 has a source terminal coupled with a terminal providing the power supply voltage through a controlled switch 310 and a drain terminal connected to a drain terminal of an NMOS transistor 334. The input terminal of the gain stage 224 is connected to a first terminal of a capacitor C2; the capacitor C2 has a second terminal coupled with a gate terminal of the NMOS transistor 334. The NMOS transistor 334 further includes a source terminal connected to a terminal providing the ground voltage. The gate terminal of the NMOS transistor 334 is coupled with the drain terminal thereof through a resistor RFB. The drain terminals of the transistors 333 and 334 are further coupled with an output terminal of the gain stage 224, and with a terminal providing the ground voltage through a controlled switch 311. The terminal providing the power supply voltage is coupled with the terminal providing the ground voltage through a capacitor CS. As in the gain stage 226, the controlled switches 310 and 311 are driven by the digital control signals EN and $\overline{EN}$. Particularly, the digital control signal EN drives the controlled switch 310 and the second digital control signal $\overline{EN}$ drives the controlled switch 311.

When the gain stage 224 is turned on, the controlled switch 310 is closed, while the controlled switch 311 is open. In this way, the transistor 333 is directly biased by the input signal itself, while the transistor 334 is self-biased thanks to the resistor RFB. The input signal is coupled to the transistor 333 directly, while it is coupled to the transistor 334 through the capacitor C2. When the gain stage 224 is turned off, the controlled switch 310 is open, while the controlled switch 311 is closed. In this condition no current flows, since the link with the power supply is interrupted. Even in this case, the capacitor CS is used for filtering the high frequency signals that may be superimposed on the power supply voltage.

Figure 7:
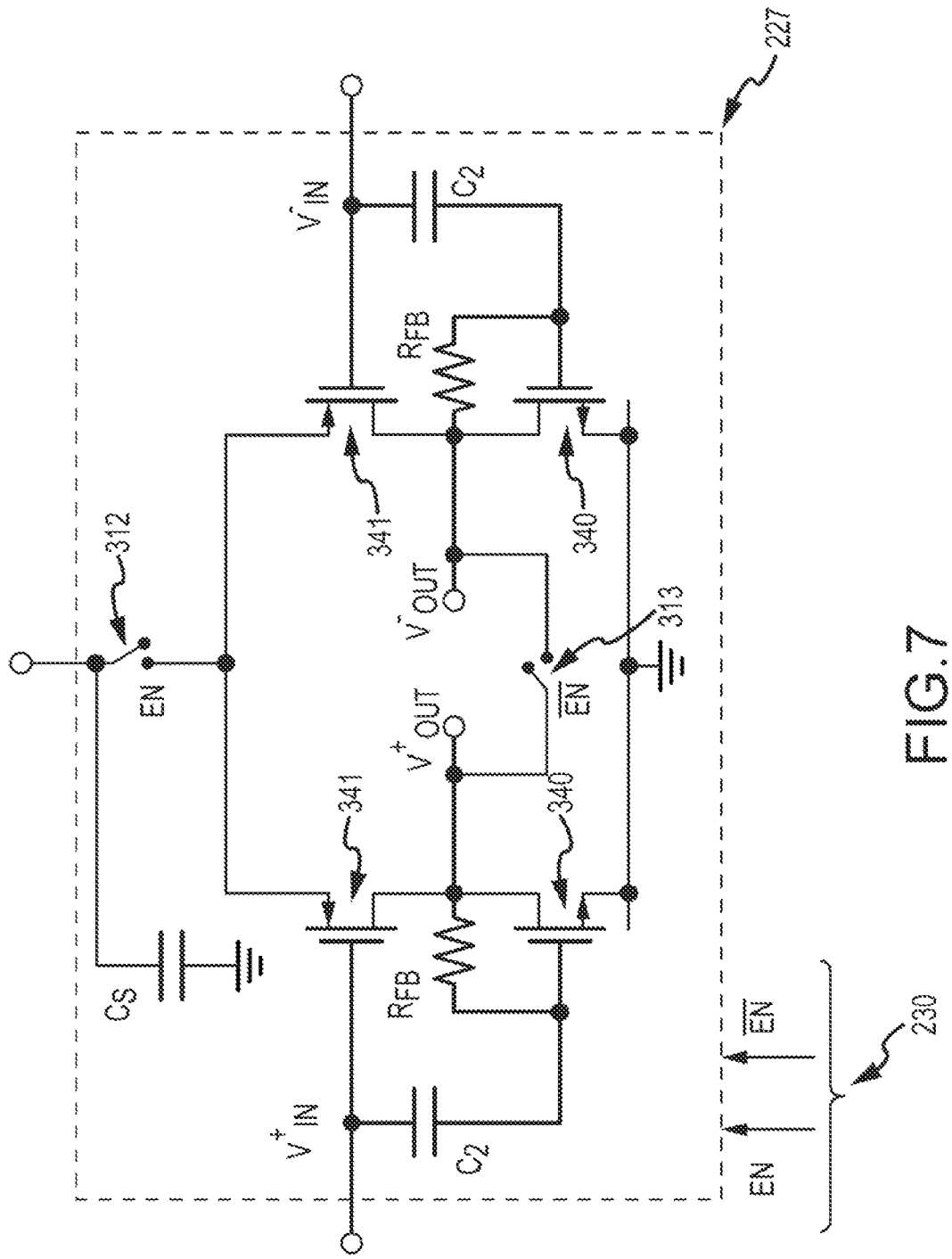
FIG. 7 illustrates a circuit implementation of a gain stage of the unitary-weight cell according to a fourth embodiment of the present invention.

A fourth implementation of the gain stage 220 according to an embodiment of the present invention is disclosed in FIG. 7 with the reference 227. This implementation is a differential-version of the gain stage 224, which requires a lower number of controlled switches. In this case, the input signal to be amplified is provided to the gain stage 227 in a differential way. The gain stage 227 has a positive input terminal coupled with a gate terminal of a PMOS transistor 341; the PMOS transistor 341 has a source terminal coupled with a terminal providing the power supply voltage through a controlled switch 312 and a drain terminal connected to a drain terminal of an NMOS transistor 340. The positive input terminal of the gain stage 227 is connected to a first terminal of a capacitor C2; the capacitor C2 has a second terminal coupled with a gate terminal of the NMOS transistor 340. The NMOS transistor 340 further includes a source terminal connected to a terminal providing the ground voltage. The gate terminal of the NMOS transistor 340 is coupled with the drain terminal thereof through a resistor RFB. The drain terminals of the transistors 340 and 341 are further coupled with a positive output terminal of the gain stage 227.

The gain stage 227 has a negative input terminal coupled with a gate terminal of a PMOS transistor 341'; the PMOS transistor 341' has a source terminal coupled with the source terminal of the PMOS transistor 341 and a drain terminal connected to a drain terminal of an NMOS transistor 340'. The positive input terminal of the gain stage 227' is connected to a first terminal of a capacitor C2'; the capacitor C2' has a second terminal coupled with a gate terminal of the NMOS transistor 340'. The NMOS transistor 340' further includes a source terminal connected to a terminal providing the ground voltage. The gate terminal of the NMOS transistor 340' is coupled with the drain terminal thereof through a resistor RFB'. The drain terminals of the transistors 340' and 341' are further coupled with a negative output terminal of the gain stage 227. The positive output terminal and the negative output terminal are connected to each other through a controlled switch 313. The terminal providing the power supply voltage is coupled with the terminal providing the ground voltage through a capacitor CS. As in the previous cases, the controlled switches 312 and 313 are driven by the digital control signals EN and $\overline{EN}$. Particularly, the digital control signal EN drives the controlled switch 312 and the second digital control signal $\overline{EN}$ drives the controlled switch 313.

When the gain stage 227 is turned on, the controlled switch 312 is closed, while the controlled switch 313 is open. In this way the transistors 341 and 341' are biased by the input signal itself, while the transistors 340 and 340' are self-biased thanks to the resistors RFB and RFB', respectively. The input signal is directly coupled with the transistors 341, 341', and with the transistors 340, 340' through the capacitors C2 and C2', respectively. When the gain stage 227 is turned off, the controlled switch 313 is closed, while the controlled switch 312 is open. In this condition no current flows since the link with the power supply is interrupted. Even in this case, the capacitor CS is used for filtering the high frequency signals that may be superimposed on the power supply voltage.

Figure 8:
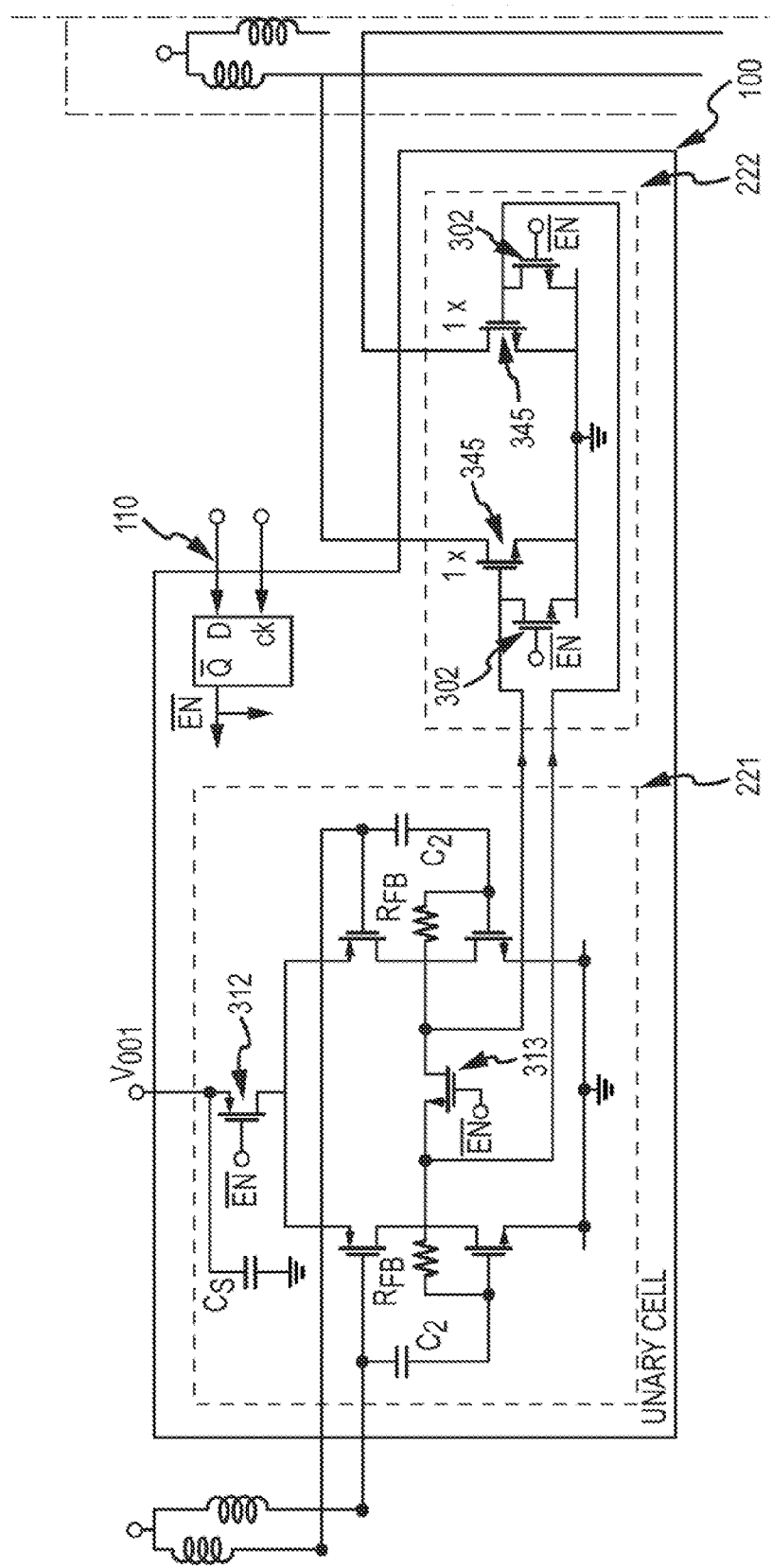
FIG. 8 illustrates a circuit implementation of the unitary-weight cell.

Another version of the unitary-weight cell 100 which includes two gain stages is illustrated in FIG. 8. The first gain stage 221 is derived from the gain stage 227 illustrated in FIG. 7, while the second gain stage 222 is derived from the gain stage 225 illustrated in FIG. 4 (the biasing 222 of such second stage being relatively simpler than the one of the gain stage 225). The control circuit 210 responsible for the generation of the digital control signals EN and $\overline{EN}$ is a digital register supplied by a clock signal for the correct timing of the turning on/off of the unitary-weight cell 100.

Figure 9:
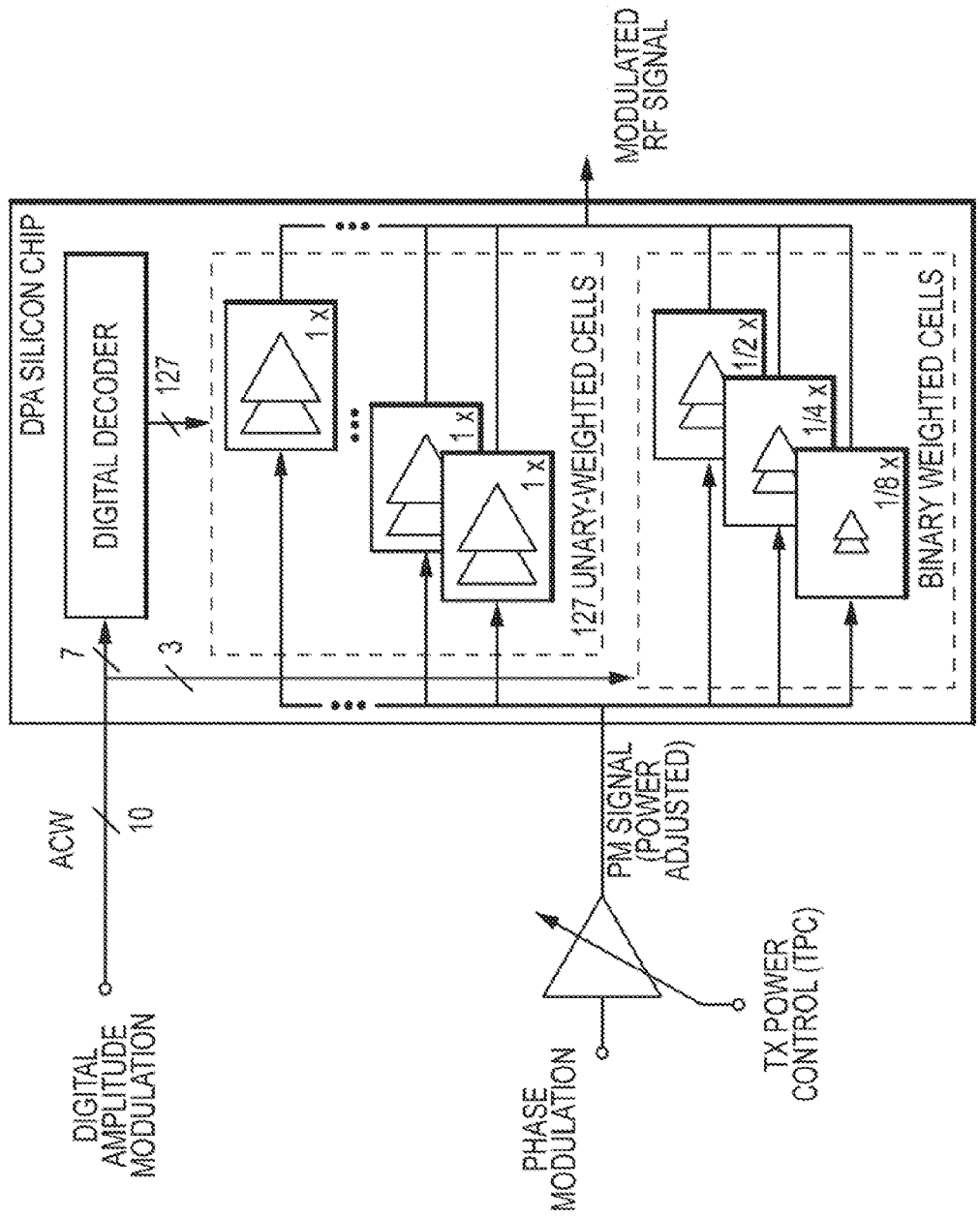
FIG. 9 illustrates an example of the digital amplitude modulator of FIG. 1 in which the amplitude control word is formed by 10 bits.
Figure 10:
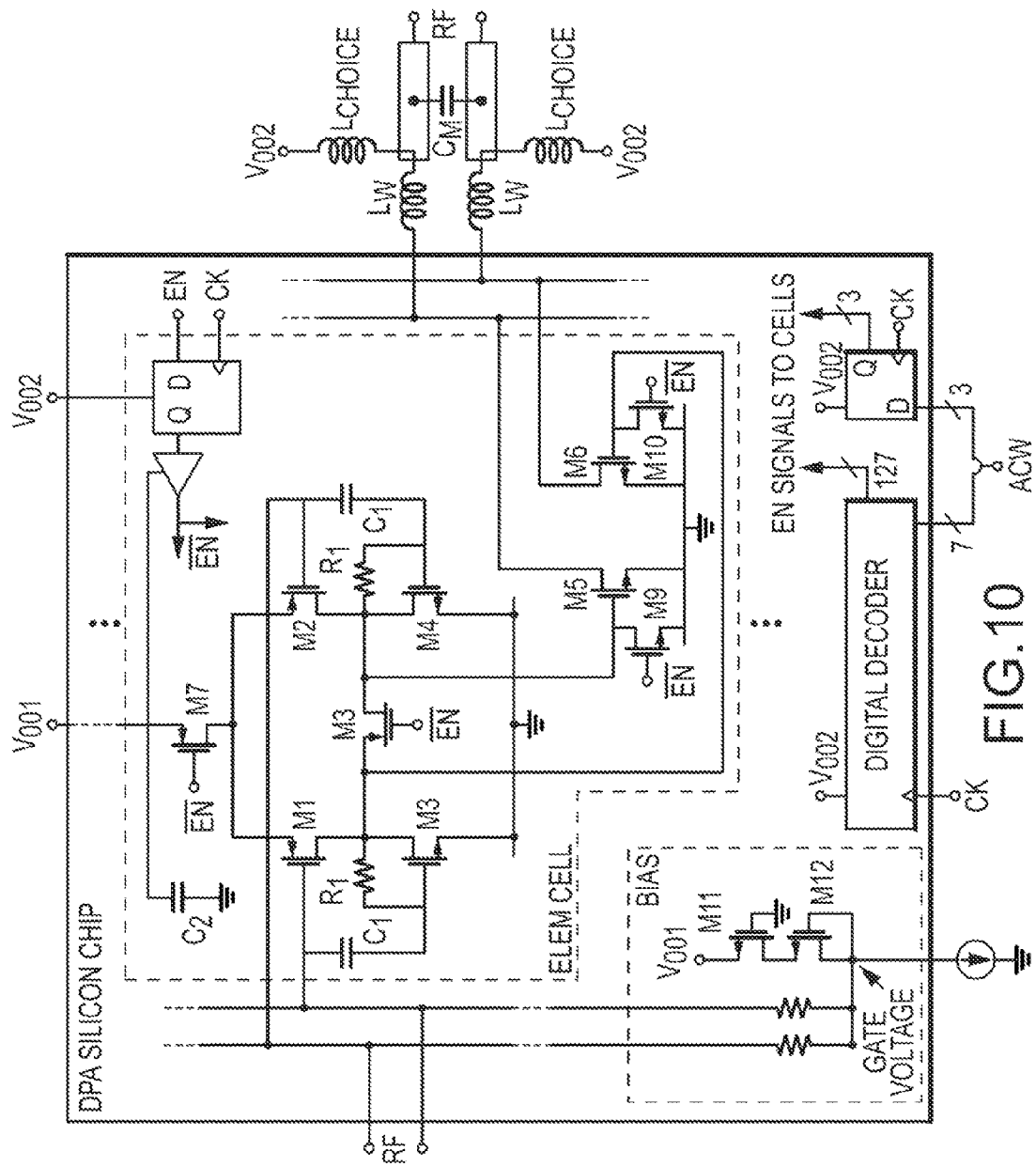
FIG. 10 is a circuital version of the digital amplitude modulator of FIG. 9.

FIG. 9 illustrates an example of the proposed digital amplitude modulator 90, corresponding to the case in which the amplitude control word ACW is formed by 10 bits. A possible practical circuital implementation of the digital amplitude modulator 90 is illustrated in the FIG. 10. For the sake of simplicity, only a single unitary-weight cell is shown in the circuit illustrated in FIG. 10.

Naturally, in order to satisfy local and specific requirements, a person skilled in the art may apply to the solution described above many modifications and alterations. Particularly, although the present invention has been described with a certain degree of particularity with reference to preferred embodiment(s) thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, although in the description the digital amplitude modulator includes both an array of unitary-weight cells and a further array of fractional-weight cells, the concepts of the present inventions apply in case the fractional-weight cells are not included.

Even if the digital amplitude modulator described in the previous is adapted to perform a modulation of the polar type, similar considerations apply to a modulation system capable of performing a cartesian modulation. Particularly, such modulation system may include two digital amplitude modulators equal to that previously described; in this case, the RF carrier signals exploited by such two digital amplitude modulators are in quadrature, and the output signal of the system is given by the sum of the output signals of the two digital amplitude modulators.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A digital amplitude modulator for modulating the amplitude of an input carrier signal based on input digital data and generating a corresponding output signal, the digital amplitude modulator including:
   a first variable gain amplifier for receiving the input carrier signal and generating a corresponding first amplified carrier signal;
   a second variable gain amplifier for receiving the input digital data and generating corresponding digital amplitude control data;
   a plurality of selectively activatable amplifier stages, each one receiving a replica of the first amplified carrier signal and generating a corresponding second amplified carrier signal when activated, the output signal corresponding to a combination of the second amplified carrier signals generated by the activated amplifier stages;
   a driving circuit configured to receive the digital amplitude control data and activate a corresponding set of selected amplifier stages based on the digital amplitude control data, and
   a power controller unit configured to adjust the power delivered by the digital amplitude modulator by setting a first amplifying gain of the first variable gain amplifier and a second amplifying gain of the second variable gain amplifier.

2. The digital amplitude modulator of claim 1, wherein:
   in response to a request for decreasing the power delivered by the digital amplitude modulator, the power controller unit is configured to decrease the second amplifying gain if the resolution of the digital amplitude control data is higher than a minimum threshold, or decrease the first amplifying gain if the resolution of the digital amplitude control data is lower than or equal to the minimum threshold, and
   in response to a request for increasing the power delivered by the digital amplitude modulator, the power controller unit is configured to increase the second amplifying gain if the amplitude of the first amplified carrier signal is higher than or equal to a maximum threshold, or increase the first amplifying gain if the amplitude of the first amplified carrier signal is lower than the maximum threshold.

3. The digital amplitude modulator of claim 1, wherein the plurality of selectively activatable amplifier stages includes:
   a first set of amplifier stages, all the amplifier stages of the first set having a same base amplifying gain, and
   a second set of amplifier stages, each amplifier stage of the second set having a respective fractional amplifying gain corresponding to a respective fraction of the base amplifier gain.

4. The digital amplitude modulator claim 1, wherein each amplifier stage includes:
   a single gain stage having an input terminal configured to receive the replica of the first amplified carrier signal and an output terminal configured to provide the second amplified carrier signal, or
   a sequence of gain stages each one having an input terminal and an output terminal, the input terminal of each gain stage in the sequence different from a first gain stage of the sequence being connected to the output terminal of the preceding gain stage in the sequence, the input terminal of the first gain stage being configured to receive the replica of the first amplified carrier signal, the output terminal of a last gain stage of the sequence being configured to provide the second amplified carrier signal.

5. The digital amplitude modulator of claim 4, wherein at least one gain stage of the amplifier stage includes:
   a first transistor having a control terminal coupled with the input terminal through a first capacitor, a first conduction terminal coupled with a terminal providing a reference voltage and a second conduction terminal coupled with the output terminal, and
   a first resistor having a first terminal coupled with a terminal providing a bias voltage through a first controlled switch and a second terminal coupled with the control terminal of the first transistor, wherein:
   the control terminal of the first transistor is further coupled with a terminal providing the reference voltage through a second controlled switch, and
   the first and the second controlled switches are controlled by the driving circuit based on the digital amplitude control data.

6. The digital amplitude modulator of claim 4, wherein at least one gain stage of the amplifier stage includes:
   a second transistor of a first conductivity type having a control terminal coupled with the input terminal through a second capacitor and a second controlled switch, a first conduction terminal coupled with a terminal providing a reference voltage and a second conduction terminal coupled with the output terminal,
   a third transistor of a second conductivity type opposite to the first conductivity type, the third transistor having a control terminal coupled with the input terminal through a third controlled switch, a first conduction terminal coupled with the second conduction terminal of the second transistor and a second conduction terminal coupled with a terminal providing a bias voltage, and
   a second resistor having a first terminal coupled with the control terminal of the second transistor and a second terminal coupled with the output terminal, wherein
   the control terminal of the third transistor is further coupled with a terminal providing the reference voltage through a fourth controlled switch and to the second conduction terminal of the third transistor through a fifth controlled switch, and
   the second, third, fourth and fifth controlled switches are controlled by the driving circuit based on the digital amplitude control data.

7. The digital amplitude modulator of claim 4, wherein at least one gain stage of the amplifier stage includes:
   a fourth transistor of a first conductivity type having a control terminal coupled with the input terminal through a third capacitor, a first conduction terminal coupled with a terminal providing a reference voltage and a second conduction terminal coupled with the output terminal,
   a fifth transistor of a second conductivity type opposite to the first conductivity type, the fifth transistor having a control terminal coupled with the input terminal, a first conduction terminal coupled with the second conduction terminal of the fourth transistor and a second conduction terminal coupled with a terminal providing a bias voltage through a sixth controlled switch, and
   a third resistor having a first terminal coupled with the control terminal of the fourth transistor and a second terminal coupled with the output terminal, wherein
   the second terminal of the fourth transistor is further coupled with a terminal providing the reference voltage through a seventh controlled switch, and
   the sixth and seventh controlled switches are controlled by the driving circuit based on the digital amplitude control data.

8. The digital amplitude modulator of claim 4, wherein at least one gain stage of the amplifier stage is a differential gain stage having a further input terminal and a further output terminal, said at least one gain stage including:
   a sixth transistor of a first conductivity type having a control terminal coupled with the input terminal through a fourth capacitor, a first conduction terminal coupled with a terminal providing a reference voltage and a second conduction terminal coupled with the output terminal,
   a seventh transistor of a second conductivity type opposite to the first conductivity type, the fifth transistor having a control terminal coupled with the input terminal, a first conduction terminal coupled with the second conduction terminal of the sixth transistor and a second conduction terminal coupled with a terminal providing a bias voltage through an eighth controlled switch,
   a fourth resistor having a first terminal coupled with the control terminal of the sixth transistor and a second terminal coupled with the output terminal,
   an eighth transistor of the first conductivity type having a control terminal coupled with the further input terminal through a fifth capacitor, a first conduction terminal coupled with a terminal providing a reference voltage and a second conduction terminal coupled with the further output terminal, and
   a ninth transistor of the second conductivity type having a control terminal coupled with the further input terminal, a first conduction terminal coupled with the second conduction terminal of the eighth transistor and a second conduction terminal coupled with the second conduction terminal of the seventh transistor,
   a fifth resistor having a first terminal coupled with the control terminal of the eighth transistor and a second terminal coupled with the further output terminal, wherein
   the output terminal is coupled with the output terminal through a ninth controlled switch, and
   the eighth and ninth controlled switches are controlled by the driving circuit based on the digital amplitude control data.

9. A method for operating a digital amplitude modulator configured to modulate the amplitude of an input carrier signal based on input digital data and generate a corresponding output signal and including a plurality of selectively activatable amplifier stages, the method comprising the following steps:
   generating a first amplified carrier signal by multiplying the input carrier signal by a first amplifying gain,
   generating digital amplitude control data by multiplying the input digital data by a second amplifying gain,
   providing a replica of the first amplified carrier signal to each amplifier stage, each amplifier stage being configured to generate a corresponding second amplified carrier signal when activated,
   activating a set of selected amplifier stages based on the digital amplitude control data, the output signal corresponding to a combination of the second amplified carrier signals generated by the activated amplifier stages, adjusting the power delivered by the digital amplitude modulator by setting the first amplifying gain and the second amplifying gain.

10. The method of claim 9, wherein:
in response to a request for decreasing the power delivered by the digital amplitude modulator, the step of adjusting the power includes decreasing the second amplifying gain if the resolution of the digital amplitude control data is higher than a minimum threshold, or decreasing the first amplifying gain if the resolution of the digital amplitude control data is lower than or equal to the minimum threshold, and
in response to a request for increasing the power delivered by the digital amplitude modulator, the step of adjusting the power includes increasing the second amplifying gain if the amplitude of the first amplified carrier signal is higher than or equal to a maximum threshold, or increasing the first amplifying gain if the amplitude of the first amplified carrier signal is lower than the maximum threshold.

11. A digital amplitude modulator, comprising:
a variable gain amplifier adapted to receive a carrier signal and a digital amplitude control signal, the variable gain amplifier operable to apply a first gain to the carrier signal to generate a first amplified carrier signal and to apply a second gain to the digital amplitude control signal to generate an amplified digital amplitude control signal and to decode the amplified digital amplitude control signal to generate digital control signals, the second gain having a value that is independent of the value of the first gain;
a plurality of amplifier stages coupled to the variable gain amplifier, each amplifier stage receiving a replica of the first amplified carrier signal and a corresponding one of the digital control signals and operable when activated by the corresponding digital control signal to generate a corresponding second amplified carrier signal;
a combining circuit coupled to the plurality of amplifier stages, the combining circuit operable to generate an output signal having a value that is proportional to the sum of second amplified carrier signals provided by the activated amplifier stages; and
a power control circuit coupled to the variable gain amplifier and adapted to receive a power control command signal,
the power control circuit operable in a first mode responsive to the power control command signal indicating the power of the output signal should be decreased to reduce the second gain if a resolution of the amplified digital amplitude control signal is greater than a first threshold value and to reduce the first gain if the resolution of the amplified digital amplitude control signal is less than or equal to the first threshold value, and
the power control circuit operable in a second mode responsive to the power control command signal indicating the power of the output signal should be increased to raise the second gain if the first amplified carrier signal has an amplitude that has reached a second threshold value and to raise the first gain if the first amplified carrier signal has an amplitude that is less than the second threshold value.

12. The digital amplitude modulator of claim 11 wherein the variable gain amplifier is further operable to phase shift the first amplified input carrier signal relative to the input carrier signal.

13. The digital amplitude modulator of claim 11 wherein there are N+M amplifier stages, N amplifier stages having a unit gain A0 and M amplifier stages having fractional unit gains having a value less than the unit gain A0.

14. The digital amplitude modulator of claim 13 wherein the M amplifier stages have respective fractional unit gains given by A0/2X where X varies from 1 to M for these M amplifier stages.

15. The digital amplitude modulator of claim 11 wherein the variable gain amplifier comprises:
a first variable gain amplifier adapted to receive the carrier signal and apply the first gain to the carrier signal to generate the first amplified carrier signal;
a signal splitting circuit coupled to the first variable gain amplifier and operable responsive to the first amplified carrier signal to generate the replica of the first amplified carrier signal applied to each amplifier stage;
a second variable gain amplifier adapted to receive the digital amplitude control signal and operable to apply the second gain to the digital amplitude control signal to generate the amplified digital amplitude control signal; and
a digital decoder circuit coupled to the second variable gain amplifier to receive the amplified input signal data and to decode the amplified input signal data to generate the digital control signals.

16. The digital amplitude modulator of claim 11 wherein each amplifier stage comprises a single gain stage having an input node adapted to receive the replica of the first amplified carrier signal and an output node coupled to the combining circuit.

17. The digital amplitude modulator of claim 11 wherein each amplifier stage comprises a plurality of gain stages connected in series between an input node adapted to receive the replica of the first amplified carrier signal and an output node coupled to the combining circuit.

18. The digital amplitude modulator of claim 17 wherein each amplifier stage comprises:
a differential gain stage including,
a first capacitive element;
a first transistor having a control node coupled to a first input node through the first capacitive element, a first conduction node adapted to receive a reference voltage and a second conduction node coupled to a first output node;
a second transistor having a control node coupled to the first input node, a first conduction node coupled to the first output node and a second conduction node coupled to a biasing node;
a biasing transistor having a control node coupled to receive an enable signal, a first conduction node adapted to receive a supply voltage and a second conduction node coupled to the biasing node;
a first resistive element having a first node coupled to the control node of the first transistor and a second node coupled to the first output node;
a second capacitive element;
a third transistor having a control node coupled to a second input node through the second capacitive element, a first conduction node adapted to receive the reference voltage and a second conduction node coupled to a second output node;
a fourth transistor having a control node coupled to the second input node, a first conduction node coupled to the second output node and a second conduction node coupled to the biasing node;

a second resistive element having a first node coupled to the control node of the third transistor and a second node coupled to the second output node;

a fifth transistor having first and second conduction nodes coupled to the first and second output nodes, respectively, and having a control node coupled to receive the enable signal;

a control circuit adapted to receive a clocking signal and operable responsive to the clocking signal to generate the enable signal;

a second stage including, a sixth transistor having a control node coupled to the first output node, a first conduction node adapted to receive the reference voltage and a second conduction node coupled to a first final output node;

a seventh transistor having a control node coupled to the second output node, a first conduction node adapted to receive the reference voltage and a second conduction node coupled to a second final output node an eighth transistor having a control node coupled to the control circuit to receive the enable signal, a first conduction node adapted to receive the reference voltage and a second conduction node coupled to the control node of the sixth transistor; and a ninth transistor having a control node coupled to the control circuit to receive the enable signal, a first conduction node adapted to receive the reference voltage and a second conduction node coupled to the control node of the seventh transistor.

19. An electronic system, comprising:

first and second digital amplitude modulators adapted to receive first and second carrier signals, respectively, the first and second carrier signals being in quadrature and each of the digital amplitude modulators comprising, a variable gain amplifier adapted to receive the corresponding carrier signal and a digital amplitude control signal, the variable gain amplifier operable to apply a first gain to the carrier signal to generate a first amplified carrier signal and to apply a second gain to the digital amplitude control signal to generate an amplified digital amplitude control signal and to decode the amplified digital amplitude control signal to generate digital control signals, the second gain having a value that is independent of the value of the first gain;

a plurality of amplifier stages coupled to the variable gain amplifier, each amplifier stage receiving a replica of the first amplified carrier signal and a corresponding one of the digital control signals and operable when activated by the corresponding digital control signal to generate a corresponding second amplified carrier signal;

a combining circuit coupled to the plurality of amplifier stages, the combining circuit operable to generate an output signal having a value that is proportional to the sum of second amplified carrier signals provided by the activated amplifier stages;

a power control circuit coupled to the variable gain amplifier and adapted to receive a power control command signal, the power control circuit operable in a first mode responsive to the power control command signal indicating the power of the output signal should be decreased to reduce the second gain if a resolution of the amplified digital amplitude control signal is greater than a first threshold value and to reduce the first gain if the resolution of the amplified digital amplitude control signal is less than or equal to the first threshold value, and the power control circuit operable in a second mode responsive to the power control command signal indicating the power of the output signal should be increased to raise the second gain if the first amplified carrier signal has an amplitude that has reached a second threshold value and to raise the first gain if the first amplified carrier signal has an amplitude that is less than the second threshold value; and a summing circuit operable to sum the output signals from the first and second digital amplitude modulators to generate an overall output signal.

20. The electronic system of claim 19 wherein the electronic system comprises a wireless mobile electronic device.

21. A method for operating a digital amplitude modulator, comprising:

multiplying a carrier signal by a first gain to generate an amplified carrier signal;

multiplying a digital amplitude control signal by a second gain to generate an amplified digital amplitude control signal;

splitting the amplified carrier signal to generate X corresponding split amplified carrier signals where X is an integer;

multiplying Y split amplified carrier signals by a corresponding stage gain where Y is an integer that is less than or equal to X and Y has a value determined from the amplified digital amplitude control signal;

combining the Y split amplified carrier signal to generate an output signal;

controlling the power of the output signal in a first mode when a power control command signal indicates the power of the output signal is to be decreased by, lowering the second gain when a resolution of the amplified digital amplitude control signal is greater than a first threshold value, lowering the first gain when the resolution of the digital amplitude control signal is less than or equal to the first threshold value; and controlling the power of the output signal in a second mode when the power control command signal indicates the power of the output signal is to be increased by, raising the second gain when the first amplified carrier signal has an amplitude that has reached a second threshold value, and raising the first gain when the amplified carrier signal has an amplitude that is less than the second threshold value.

22. The method of claim 21 wherein multiplying the carrier signal by the first gain further comprising shifting a phase of the carrier signal.

23. The method of claim 21 wherein multiplying Y split amplified carrier signals comprises:

multiplying N split amplified carrier signals by a first stage gain where N is an integer that is less than Y and N is determined by the value of the amplified digital amplitude control signal; and multiplying at least some of Y−N amplified carrier signals by respective fractional stage gains, wherein each respective fractional stage gain has value that is a different fraction of the first gain and number of the Y−N amplified carrier signals that are multiplied by fractional stage gains and the specific fractional stage gains utilized are determined by the amplified digital amplitude control signal.

24. The method of claim 21 wherein the carrier signal comprises an RF signal.

25. The method of claim 21 wherein the RF signal has a frequency in the range of 0.7 to 5.8 GHz.

* * * * *